United States Patent [19]
Nagy

[11] Patent Number: 5,703,810
[45] Date of Patent: Dec. 30, 1997

[54] DRAM FOR TEXTURE MAPPING

[75] Inventor: Michael Nagy, San Ramon, Calif.

[73] Assignee: Silicon Graphics, Inc., Mountain View, Calif.

[21] Appl. No.: 573,254

[22] Filed: Dec. 15, 1995

[51] Int. Cl.$^6$ .................................................. G11C 7/00
[52] U.S. Cl. .................... 365/189.05; 365/195; 365/222; 365/230.04; 365/230.05
[58] Field of Search .............................. 365/189.05, 195, 365/222, 230.04, 230.05

[56] References Cited

U.S. PATENT DOCUMENTS 5,568,428  10/1996  Toda ..................... 365/189.05

*Primary Examiner*—David C. Nelms
*Assistant Examiner*—F. Niranjan

*Attorney, Agent, or Firm*—Blakeley, Sokoloff, Taylor & Zafman

[57] ABSTRACT

A latch/mask mechanism that is located between the sense amplifiers of a DRAM and the data bus. The latch/mask mechanism decouples the data bus from the sense amplifiers and permits innovative, time saving functionality during read and write operations. During a write operation, the latch can receive only those byte(s) or a row of bytes to be written. Corresponding mask bits are set to indicate those bytes to be written. Logic in the device transfers only those bytes in the row to be written to the sense amplifiers for writing to memory, leaving the data of remaining bytes in memory intact. Read operations are rendered more efficient by enabling logic, coupled to column select logic, to automatically transfer from the latch the byte selected by the column select logic and the adjacent byte. This time saving feature is particularly useful for computer graphics applications which utilize linear interpolation processes.

13 Claims, 5 Drawing Sheets

DRAM FOR TEXTURE MAPPING

BACKGROUND OF THE INVENTION

1. Field of the Invention

Field of the present invention relates to the accessing of dynamic random access memory.

2. Art Background

The number of clock cycles required to read and write to random access memories can be significant in high speed computing applications. Therefore it is desirable to minimize the number of clock cycles required to perform read and write accesses to memory.

One example where the number of clock cycles is significant is a write operation wherein selected bytes of a multiple word are written. A read-modify-write operation is performed wherein the word is read into the sense amplifiers, the data to be written are loaded in the sense amplifiers replacing the data read and the revised word, consisting partially of data read from the memory and partially of the updated data, is written back to the memory. Therefore, the elimination of the steps to read and modify the read data would provide substantial time savings.

One approach to achieve faster memory access is to provide an on-chip cache memory. This approach relies on the locality of access to increase speed. However, in some applications where locality of access is not expected, for example in some computer graphics applications, increased speed of access is not realized.

Improvements in the timing of read operations is often desirable for particular applications. One example is the processing of digital images and textures. Such processing typically involves bi-linear interpolations. Linear interpolations require two adjacent data values. Therefore it is desirable to automatically concurrently read two adjacent data values using a single memory address.

SUMMARY OF THE INVENTION

It is therefore an object of the present invention to provide a dynamic RAM (DRAM) in which the number of clock cycles required to perform a write operation is decreased.

It is further an object of the present invention to produce a DRAM in which the number of clock cycles required to access pairs of addresses is reduced.

The present invention provides a method and apparatus to increase the speed of access of a dynamic random access memory (DRAM). The present invention provides a latch/mask between the sense amplifiers of the DRAM and the data bus. To perform a write operation, the data and corresponding mask bits are loaded into the latch/mask. A mask bit is associated with each byte of data. Data is transferred to the sense amplifiers for updating the DRAM one word at a time. The mask bits control whether data is transferred to the sense amplifiers. Therefore, only specified bytes of the word are written; those bytes that have a corresponding mask bit set remain in the same state as prior to the write operation. This process greatly enhances the speed of a write access as the time consuming prior art read-modify-write operation is avoided. Furthermore, the write operation can be pipelined such that once write data is transferred to the sense amplifiers, new write data can be loaded into the latch/mask for subsequent transfer to the sense amplifiers and DRAM.

Similarly, in one embodiment, the DRAM is configured such that a first portion of the row, for example, the even addressed locations is accessed from a first side of the DRAM array and a second portion, for example, the odd addressed locations, is accessed from an opposing side of the array. A latch is coupled between the sense amplifiers associated with each side of the array and the data bus. When a read address is received, both sets of sense amplifiers sense data which are transferred to the corresponding latch/masks. The column decode circuitry is configured to control that the data for the address requested and the next adjacent address are transferred to the data bus. Thus, for the same amount of time required to access data at a single address, data at two adjacent addresses are accessed. This is particularly advantageous in certain computer graphics applications that utilize linear interpolation.

BRIEF DESCRIPTION OF THE DRAWINGS

The objects features and advantages of the present invention are apparent to one skilled in the art in light of the following description in which.

DETAILED DESCRIPTION

In the following description, for purposes of explanation, numerous details are set forth, in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 1A:
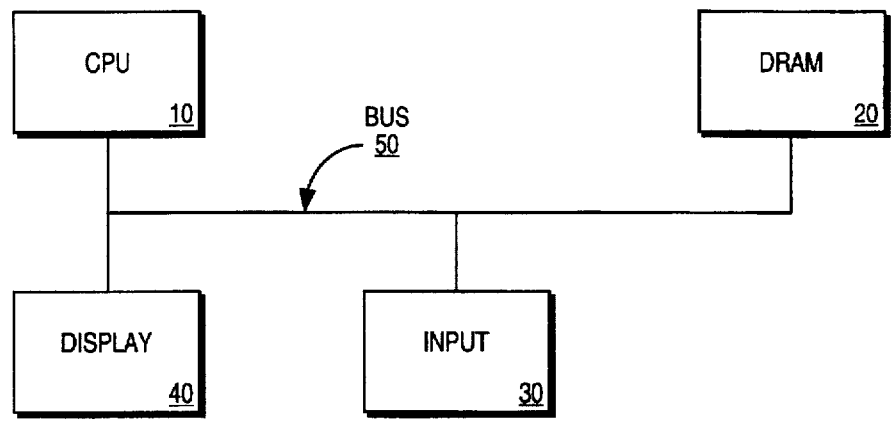
FIG. 1a and FIG. 1b illustrate embodiments of systems that utilize a DRAM in accordance with the teachings of the present invention.
Figure 1B:
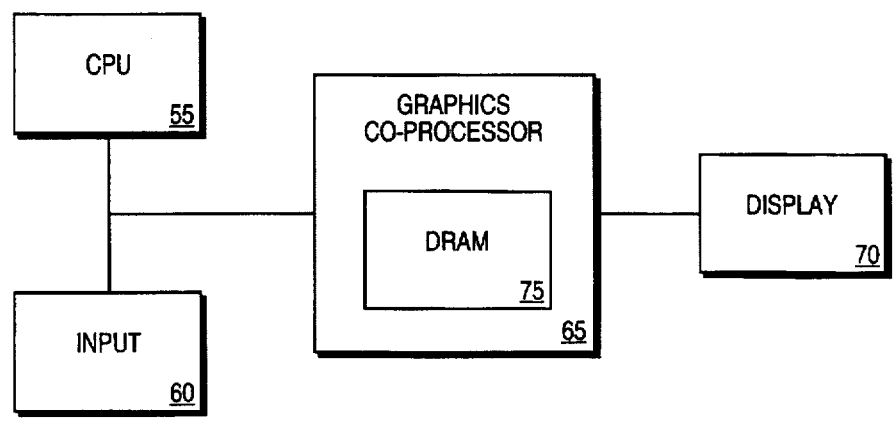

The present invention provides an innovative DRAM structure that enables faster read and write accesses to be performed. A simplified block diagram of a system that includes this structure is illustrated in FIG. 1a. FIG. 1a illustrates a computer system configured to have a central processing unit (CPU) 10, DRAM 20, input device 30 and display 40, coupled via a bus 50. It is readily apparent that the computer system illustrated by FIG. 1a is just one example and a variety of configurations using a variety of devices can be used. Another example is illustrated in FIG. 1b. FIG. 1b is illustrative of a system that includes a CPU 55, input device 60 coupled to a graphics co-processor 65. The graphics co-processor 65 off-loads the graphics processing burden from the CPU 55, enabling the CPU 55 to achieve greater throughput. The graphics co-processor 65 is coupled to the display device 70. The graphics co-processor 65 includes an embedded DRAM 75 for wider bus bandwidth.

Figure 2A:
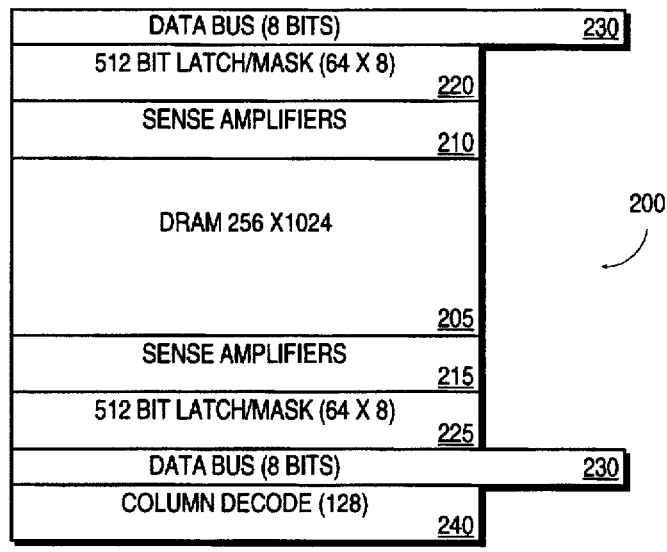
FIG. 2a illustrates one embodiment of a DRAM in accordance with the teachings of the present invention and FIG. 2b illustrates a grouping of 8 memory blocks.
Figure 2B:
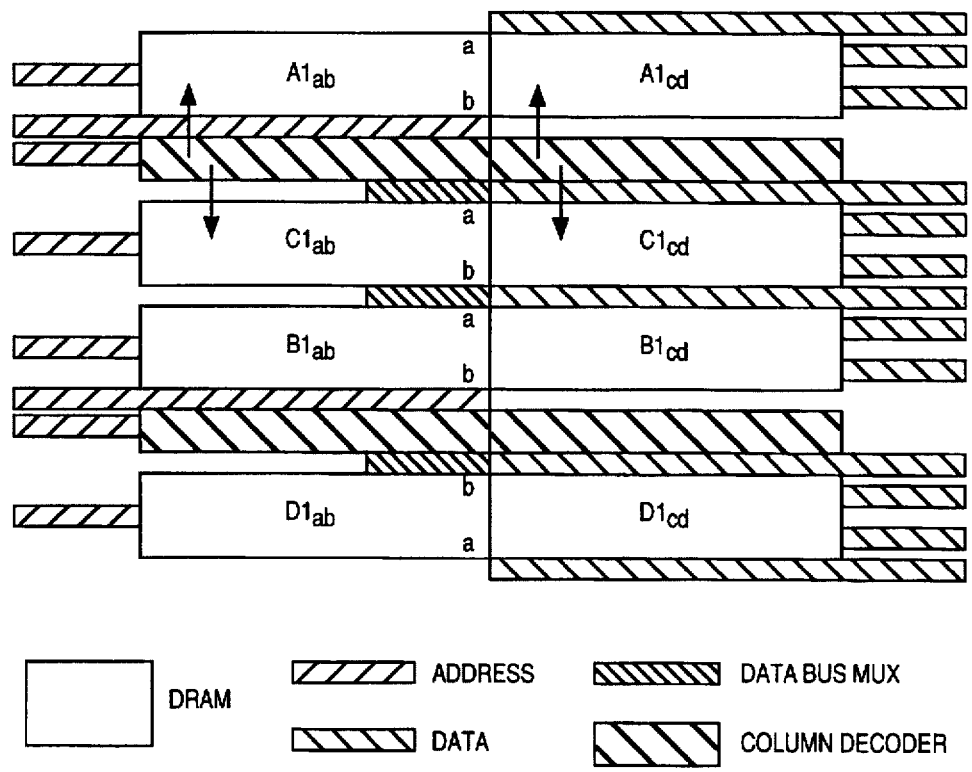

A block diagram representation of one embodiment of the DRAM of the present invention is illustrated in FIG. 2a. The DRAM 200 includes the DRAM array 205, sense amplifiers 210, 215 and latch/mask 220, 225. The sense amplifiers 210, 215 are of a sufficient size to perform accesses on a row basis. In the present embodiment, each set of sense amplifiers 210, 215 senses 512 bits of a 1024 bit row of the DRAM array 205. Each latch/mask 220, 225 coupled respectively to sense amplifiers 210, 215 consists of 512 bits of data and 64 bits of mask data (1 bit for each byte of the row). The mask data is generated and loaded into the latch/mask 220, 225 when write accesses are performed. Selective data received in the latch is transferred from the data bus 230 during a write access and to the data bus 230 during a read access. As is well known in the art, column decode circuitry 240 controls the columns of the row transferred to the data bus 230. This structure is configurable into space saving groups, such as a group of 8 memory blocks as illustrated in FIG. 2b.

Figure 3:
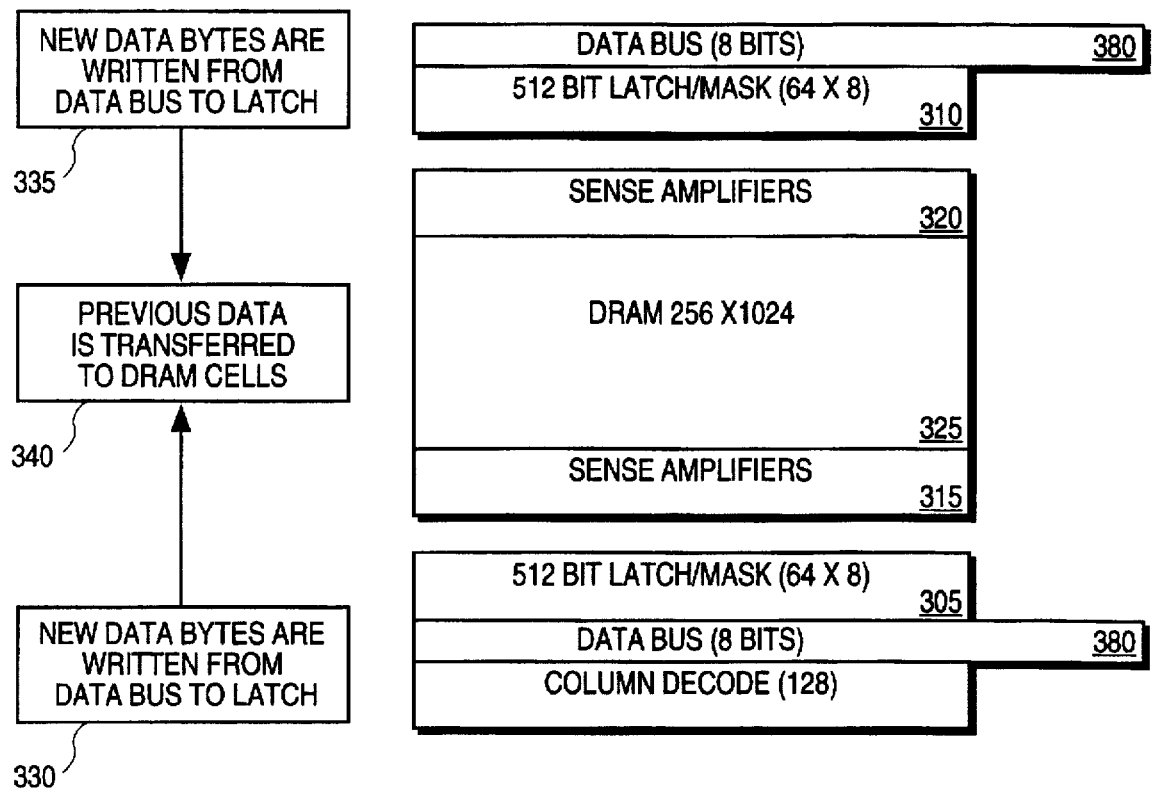
FIG. 3 illustrates an exemplary write operation in accordance with the teachings of the present invention.

A write access in accordance with the teachings of the present invention will be explained with reference to FIG. 3. As noted earlier, in the prior art, a read-modify-write operation is typically performed wherein data preexisting in the row is sensed by the sense amplifiers. The system then writes over the particular data in the row to be changed and writes the entire row back into memory. In the DRAM of the present invention, only selective bytes are written back to memory, eliminating the need to initially read the data in the row into the sense amplifiers. Predetermined bits of the latch/mask 305, 310 are identified as mask bits. Preferably one bit per byte of data is provided adjacent to the corresponding byte of data in the latch/mask. Logic (not shown) causes each byte in the latch/mask 305, 310 to be transferred or not to be transferred to the sense amplifiers 315, 320 and thereafter to the DRAM array 325 depending upon the state of the corresponding mask bit.

The number of clock cycles saved can be significant. For example, if each access (e.g., read or write access) takes 10 nanoseconds (ns) and the modify operations requires 16 ns, using the prior art read-modify-write operation results in 10 ns (read)+16 ns (modify)+10 ns (write)=36 ns. Using the DRAM of the present invention, a write operation requires 10 ns writing the latched data to the DRAM.

In addition, the structure enables pipelining of operations which results in additional time savings over multiple read or write operations. For example, as illustrated in FIG. 3, as data located in the sense amplifiers 315 and 320 are transferred to the DRAM array 325, step 340, new bytes of data are written from the data bus 380 to the latch/mask 305, 310, steps 330, 335, such that once the writing of data to the latch/mask 305, 310 is complete, the data is immediately available for transfer to the array 325.

Figure 4A:
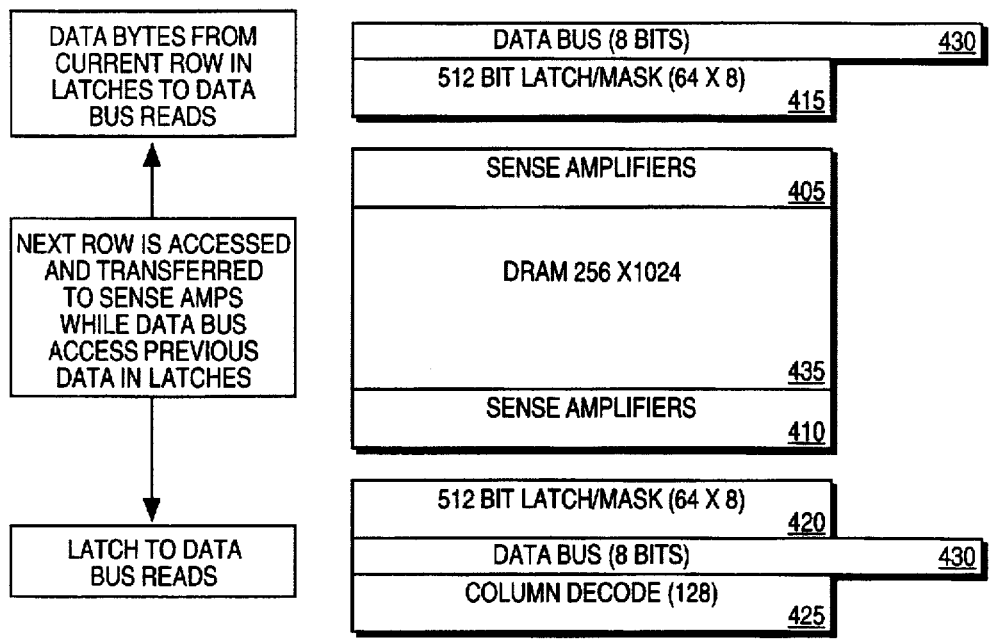
FIG. 4a illustrates an exemplary read operation in accordance with the teachings of the present invention and FIG. 4b illustrates how pairs of bytes are read in accordance with the teachings of the present invention.
Figure 4B:
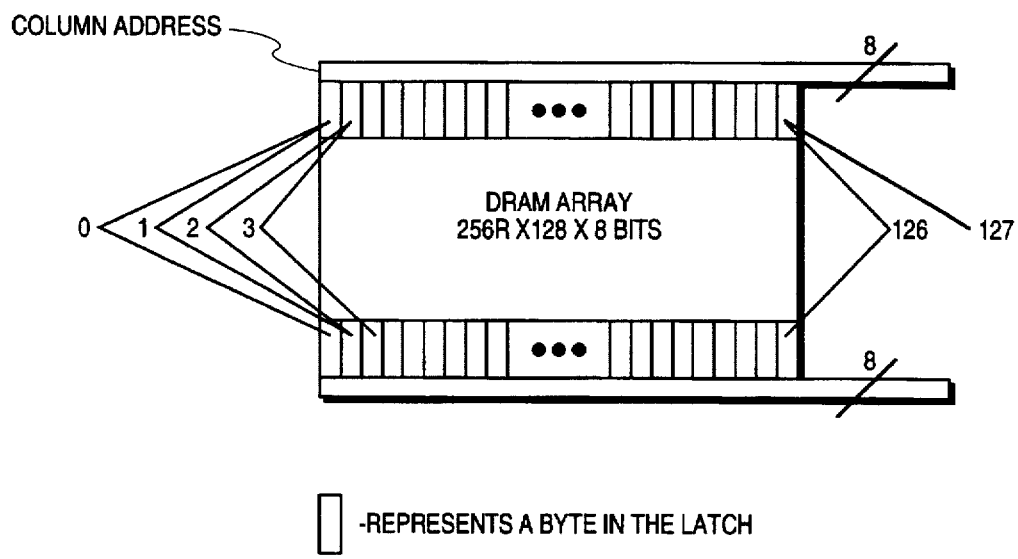

This DRAM structure also enables time savings during the performance of read operations as illustrated by FIGS. 4a and 4b. Referring to FIG. 4a, data of the row identified by the address of the operation are sensed by sense amplifiers 405, 410 and transferred to latch/mask 415, 420 for transfer of the data identified by the column decoder 425 to data bus 430. Once data is transferred from the sense amplifiers to the latch/mask 415, 420, a new row of data from the array 435 can be sensed by sense amplifiers 405, 410 concurrently with the transfer of the prior row of data from the latch mask 415, 420 to the data bus 430.

The DRAM of the present invention further provides that two bytes of data are read in response to a single address. This is particularly helpful for linear interpolations utilized frequently in computer graphics applications. Thus substantial time savings is realized as only one read access is performed to retrieved data corresponding to two addresses of data. This is illustrated in simplified form with reference to FIG. 4b. Logic circuitry (not shown) causes the byte identified by the address, e.g., column 0, and the next adjacent byte, e.g., column 1, to be retrieved in response to a single address. Although the column decode circuitry can be modified, other alternatives are contemplated.

Figure 5:
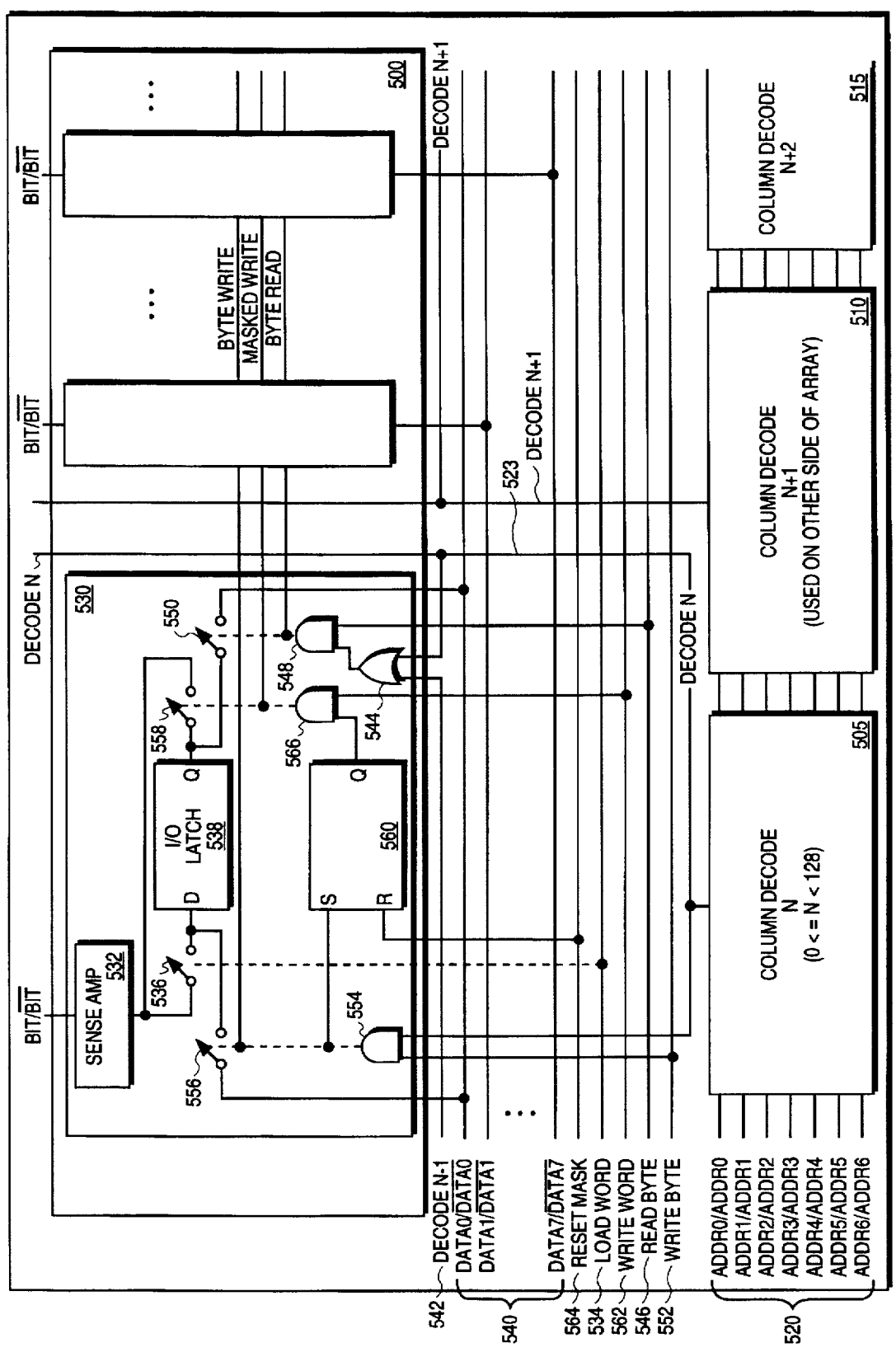
FIG. 5 is a simplified block diagram of one embodiment of the latch decode structure used.

In one embodiment set forth in FIG. 5, the column decode circuitry, 505, 510, 515 is coupled to the logic of latch/decode circuit 500. Based upon address input (addr0–6) 520, the Decode N signal line, e.g., line 523, will be activated for the corresponding column. That same Decode N signal causes the next adjacent byte to be transferred. Thus two bytes of data, corresponding to two adjacent addresses are output to the data bus in response to a single read access request, thereby eliminating the need to perform two separate accesses.

More particularly, in the present embodiment, each bit of data is processed using the elements set forth in block 530. Control signals are issued by a memory controller (not shown) which may be part of the CPU functionality or located on the DRAM component. Utilization of a memory controller is well known in the art and will not be discussed in detail herein. However, the memory controller is configured to issue the necessary control signals to the latch/decode circuitry as described below.

When a read operation occurs, the sense amplifier 532 senses the data bit from the DRAM array. Once all the bits of the row have been sensed, which preferably occurs in a concurrent manner, the load word signal line 534 goes active to transfer the bit located in the sense amplifier 532 to latch 538 (which corresponds to one bit of latch/mask 220, 225, FIG. 2). In the present embodiment, the state of the load word signal line 534 controls the closure of switch 536 to enable the bit sensed to be transferred to latch 538. This results in each bit of the addressed row of data to be transferred to corresponding latches of the latch/mask.

Continuing with the discussion with respect to one bit of one byte of the row, once loaded in the latch, the transfer of a particular byte to the data bus 540 is controlled by the Decode signal lines issued by the column decode circuitry for the byte, e.g., signal line Decode N 523 issued by column decode circuitry 505 and the column decode circuitry for the immediate prior adjacent byte, e.g., signal line Decode N–1 542 issued by column Decode circuitry N–1 (not shown). Both Decode signal lines 523, 542 are inputs to logic OR gate 544. Thus if either signal line is active, the byte will be transferred from the latch to the data bus. The timing of the transfer is controlled by Read Byte signal line 546 via logic AND gate 548. The output of AND gate is coupled to switch 550 which, when closed transfers the output of latch 538 to the corresponding line of the data bus 540 (e.g., Data 0).

To perform a write operation, data is first transferred from the data bus 540 (e.g., Data 0) to the latch 538. In the present embodiment, the Decode N signal line 523 and Write Byte signal line 552 are input to logic AND gate 554 to generate an output signal to control the closure of switch 556. Thus when the column decode circuitry indicates that the data located on the data bus is to be transferred to the corresponding byte, switch 556 is closed and the data is transferred into latch 538.

The transfer of data from the latch 538 to the sense amplifier 532 and subsequently to the array is controlled by switch 558. R S flip flop 560 is set by the output of AND gate 554 when the bit is transferred from the data bus 540 to the latch 538. The state of the corresponding mask bit (located in the latch/mask) is issued over Reset Mask signal line 564 and is input to the reset input of R S flip flop 560. When the word is to be transferred to the sense amplifier 532, an active signal is transferred over Write Word signal line 562 and input to AND gate 566. Also input to AND gate 566 is the output of R S flip flop 560. Thus, if the output of R S flip flop 560 is active (indicating that the byte is not to be masked) and the Write Word line 562 is active, the byte is not to be masked and switch 558 is closed enabling the bit stored in latch 538 to be transferred to sense amplifier 532.

The invention has been described in conjunction with the preferred embodiment. It is evident that numerous alternatives, modifications, variations and uses will be apparent to those skilled in the art in light of the foregoing description.

What is claimed is:

1. A dynamic random access memory (DRAM) comprising:
   a plurality of memory cells organized into a memory array;
   a plurality of sense amplifiers, each one of the sense amplifiers coupled to a memory cell of the plurality of memory cells such that data transferred to the sense amplifiers is written to the coupled memory cells during a write operation;
   a latch/mask device comprising a plurality of latches to store data bits arranged in bytes and mask bits, one mask bit for byte of data, each one of the plurality of latches coupled to one sense amplifier of the plurality of sense amplifiers, the state of each mask bit controlling whether the corresponding byte is to be transferred to the array such that at least one selected byte of the bytes of latches is transferred to the sense amplifiers for transfer to coupled memory cells without affecting the state of memory cells coupled to sense amplifiers coupled to non-selected bytes of the bytes of latches.

2. The DRAM as set forth in claim 1, wherein a second write operation can be initiated during a first write operation once data corresponding to a first write operation is transferred from the latch/mask device to the sense amplifiers.

3. The DRAM as set forth in claim 1, wherein during a first read operation that identifies by a first address a byte of data from the DRAM to be read, a row of data bits containing the byte identified by the first address is transferred from the memory cells to the sense amplifiers, and from the sense amplifiers to the latch/mask device, said DRAM further comprising:
   a data bus configured to transfer data bits from the latch device during the first read operation; and
   logic in the DRAM to control the latch device to transfer the byte identified by the first address and an adjacent byte during the first read operation from the latch device to the data bus.

4. The DRAM as set forth in claim 3, wherein once a row of data bits is transferred from the sense amplifiers to the latch device during the first read operation, a second read operation specifying a second address is initiated to transfer a second row of data bits from the memory cells to the sense amplifiers, such that the transfer from the latch device to the data bus of the byte identified by the first address and adjacent byte is concurrent with the transfer of a second row of data bits from the memory cells to the sense amplifiers.

5. A dynamic random access memory (DRAM) comprising:
   a plurality of memory cells organized into a memory array;
   a plurality of sense amplifiers, each one of the sense amplifiers coupled to a memory cell of the plurality of memory cells such that data transferred to the sense amplifiers is written to the coupled memory cells during a write operation;
   a latch device capable of receiving a plurality of bytes of data of a word to be transferred to corresponding sense amplifiers for transfer to memory cells when a write operation is performed, said latch device further receiving a mask bit for each byte of the latch device, said mask bit indicating whether a corresponding byte is to be transferred to the sense amplifiers such that when write operation occurs, only selected bytes of the word are transferred to the sense amplifiers.

6. The DRAM as set forth in claim 5, wherein a second write operation can be initiated during a first write operation once data corresponding to a first write operation is transferred from the latch/mask device to the sense amplifiers.

7. A method for performing a write operation of data to memory cells of a dynamic random access memory (DRAM) comprising the steps of:
   storing at least one byte of data in a latch device having a plurality of latch elements to receive a word of data composed of a plurality of bytes, each byte of the word associated with corresponding latch elements;
   transferring a plurality of mask bits to the latch device, each mask bit associated corresponding latch elements of a byte of the word, each mask bit indicating whether the data in the corresponding latch elements are to be transferred to sense amplifiers coupled to the memory cells of the DRAM;
   concurrently transferring each byte of data of the word from the latch elements to the sense amplifiers if the associated mask bit indicates that the byte is to be transferred, such that selective bytes of a word are transferred to the memory cells.

8. A dynamic random access memory (DRAM) comprising:
   a plurality of memory cells storing data bits organized into bytes, wherein a row of the memory array is composed of a plurality of bytes, each byte identified by an address;
   a plurality of sense amplifiers, each one of the sense amplifiers coupled to a memory cell of the plurality of memory cells such that a row of data bits that includes a byte of data bits identified by a first address specified by a first read operation are transferred from the memory cells to the sense amplifiers during the first read operation;
   a latch device comprising a plurality of latches to store data bits arranged in bytes each one of the plurality of latches coupled to one sense amplifier of the plurality of sense amplifiers, such that a row of data bits are transferred from the sense amplifiers to the latch device during the first read operation;
   a data bus configured to transfer data bits from the latch device during the first read operation; and
   logic in the DRAM to control the latch device to transfer the byte identified by the first address and an adjacent byte during the first read operation from the latch device to the data bus.

9. The DRAM as set forth in claim 8, wherein during a write operation, data is transferred from the data bus to the latch device, said latch device transferring the data to the sense amplifiers for writing of the data to the memory cells.

10. The DRAM as set forth in claim 8, wherein once a row of data bits is transferred from the sense amplifiers to the latch device during the first read operation, a second read operation specifying a second address is initiated to transfer a second row of data bits from the memory cells to the sense amplifiers, such that the transfer from the latch device to the data bus of the byte identified by the first address and adjacent byte is concurrent with the transfer of a second row of data bits from the memory cells to the sense amplifiers.

11. The DRAM as set forth in claim 8, wherein the logic in the DRAM to control the latch device comprises:

column decode circuitry coupled to receive at least a portion of the first address to generate a decode N signal to select the byte of the row identified by the first address; and latch device control logic that receives the decode N signal and causes the transfer of byte N and byte N+1 to the data bus.

12. In a dynamic random access memory (DRAM), a method for reading bytes of data from a row of bytes of the DRAM, each byte identified by an address, said method comprising the steps of:

(a) transferring a row of data bits that includes a byte of data bits identified by a first address specified by a first read operation to a plurality of sense amplifiers during the first read operation;

(b) transferring a row of data bits from the sense amplifiers to a latch device comprising a plurality of latches arranged in bytes during the first read operation (c) transferring the byte identified by the first address and an adjacent byte during the first read operation from the latch device to a data bus.

13. The method as set forth in claim 11, wherein subsequent to step (b) and concurrent with step (c), further comprising the step of:

(d) initialing a second read operation specifying a second address to transfer a second row of data bits from the memory cells to the sense amplifiers.

* * * * *